(12) United States Patent
Uchida et al.

(10) Patent No.: US 7,517,553 B2
(45) Date of Patent: Apr. 14, 2009

(54) ADHESIVE AID COMPOSITION

(75) Inventors: Makoto Uchida, Tokyo (JP); Toyofumi Asano, Tokyo (JP)

(73) Assignee: Nippon Kayaku Kabushiki Kaisha, Tokyo (JP)

( * ) Notice: Subject to any disclaimer, the term of this patent is extended or adjusted under 35 U.S.C. 154(b) by 449 days.

(21) Appl. No.: 10/573,303

(22) PCT Filed: May 11, 2004

(86) PCT No.: PCT/JP2004/006259

§ 371 (c)(1),
(2), (4) Date: Apr. 26, 2006

(87) PCT Pub. No.: WO2005/030896

PCT Pub. Date: Apr. 7, 2005

(65) Prior Publication Data

US 2007/0026227 A1      Feb. 1, 2007

(30) Foreign Application Priority Data

Sep. 26, 2003 (JP) .............................. 2003-336243

(51) Int. Cl.
*B05D 1/38* (2006.01)

(52) U.S. Cl. ..................... 427/96.1; 427/96.2; 427/340; 427/412.1

(58) Field of Classification Search ................. 427/340, 427/412.1
See application file for complete search history.

(56) References Cited

U.S. PATENT DOCUMENTS 6,956,100 B2 * 10/2005 Imaizumi et al. ............ 528/310

FOREIGN PATENT DOCUMENTS

| JP | 8-143661 A | 6/1996 |
|---|---|---|
| JP | 11-106712 A | 4/1999 |
| JP | 11-195326 A | 7/1999 |
| JP | 2000-080344 | * 3/2000 |
| JP | 2000-80344 A | 3/2000 |
| JP | 2000-297151 A | 10/2000 |
| JP | 2004-197008 | * 7/2004 |

OTHER PUBLICATIONS

International Search Report for PCT/JP2004/006259 mailed Jun. 22, 2004.
Patent Abstracts of Japan for JP8-143661 published on Jun. 4, 1996.
Patent Abstracts of Japan for JP2000-80344 published on Mar. 21, 2000.
Patent Abstracts of Japan for JP11-195326 published on Jul. 21, 1999.
Patent Abstracts of Japan for JP11-106712 published on Apr. 20, 1999.
Patent Abstracts of Japan for JP2000-297151 published on Oct. 24, 2000.

* cited by examiner

*Primary Examiner*—Erma Cameron
(74) *Attorney, Agent, or Firm*—Darby & Darby P.C.

(57) ABSTRACT

The present invention provides an adhesive aid composition having excellent adhesive strength to polyimide films without decreasing mechanical properties and being useful in the field of electric materials. An adhesive aid composition of the present invention contains a phenolic hydroxyl group-containing polyamide and a solvent as essential components. The phenolic hydroxyl group-containing polyamide preferably has a segment represented by formula (1):

$$\text{—}\underset{\text{O}}{\overset{\text{O}}{\text{C}}}\text{—}\underset{(OH)_n}{\underset{|}{\bigcirc}}\text{—}\underset{\text{O}}{\overset{\text{O}}{\text{C}}}\text{—}\underset{\text{H}}{\overset{\text{H}}{\text{N}}}\text{—}R_1\text{—}\underset{\text{H}}{\overset{\text{H}}{\text{N}}}\text{—}$$ (1)

(wherein $R_1$ represents a divalent aromatic group, and n represents an average number of substituents and is a positive number of 1 to 4). The adhesive aid composition of the present invention is suitably used for bonding polyimide films.

9 Claims, No Drawings

ADHESIVE AID COMPOSITION

CROSS REFERENCE TO PRIOR APPLICATION

This is a U.S. National Phase application under 35 U.S.C. §371 of International Patent Application No. PCT/JP2004/006259 filed May 11, 2004, and claims the benefit of Japanese Patent Application No. 2003-336243 filed Sep. 26, 2003, both of which are incorporated by reference herein. The International application was published in Japanese on Apr. 7, 2005 as WO 2005/030896 a1 under PCT Article 21(2).

TECHNICAL FIELD

The present invention relates to an adhesive aid composition containing a phenolic hydroxyl group-containing polyamide and a solvent.

BACKGROUND OF THE INVENTION

In general, a metal foil (mainly a copper foil) is laminated on a polyimide film, a metal is deposited on a polyimide film by vapor deposition, plating, or sputtering, or a metal foil is coated with a polyimide precursor and then subjected to imidization by heating or the like to produce a single-sided copper-clad laminate. Furthermore, polyimide films of single-sided copper-clad laminates are bonded together with an adhesive to produce a double-sided copper-clad laminate which is further processed to a flexible printed wiring board. Namely, a polyimide film is used as a base film of a flexible printed wiring board. However, conventional polyimide films have the problem of low surface adhesiveness and thus cause defects in products without any processing. Therefore, polyimide films are surface-treated by corona discharge or plasma, for improving the surface adhesiveness. There is also a known method for roughening a surface of a polyimide film by adding inactive particles to a precursor or treating a film surface with a chemical.

Patent Document 1: Japanese Unexamined Patent Application Publication No. 8-143661.

DISCLOSURE OF INVENTION

Problem to be Solved by the Invention

Although a film surface can be provided with hydrophilicity by corona discharge treatment or plasma treatment, the surface becomes brittle and easy peelable by such treatment, thereby basically failing to improve adhesive force. Also, with a polyimide film, roughening of a film surface generally has a low effect, complicates the process for forming or processing the film, and decreases the characteristics of the film, such as strength and the like.

Means for Solving the Problem

As a result of intensive research for solving the above-mentioned problem, the inventors found an adhesive aid composition having excellent adhesiveness between films and adhesiveness to other adhesives and adhesive layers without degrading the excellent mechanical properties inherent to a film, and also found a process for preparing a film having excellent adhesiveness using the adhesive aid composition. This finding resulted in the achievement of the present invention. Namely, the present invention relates to the following:

(1) An adhesive aid composition including a phenolic hydroxyl group-containing polyamide and a solvent.

(2) The adhesive aid composition described above in (1), wherein the phenolic hydroxyl group-containing polyamide is a polyamide having a repeat structure represented by formula (3):

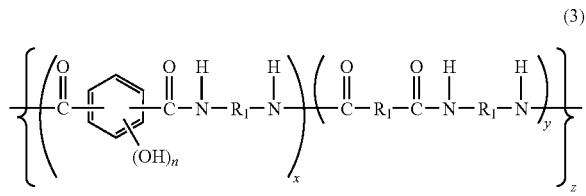

(wherein $R_1$ represents a divalent aromatic group and $R_1$s in repeat units may be the same or different; n represents an average number of substituents and is a positive number of 1 to 4; and x, y, and z represent average degrees of polymerization and are positive numbers of 1 to 10, 0 to 20, and 1 to 50, respectively).

(3) The adhesive aid composition described above in (1) or (2), prepared for a polyimide film.

(4) A film prepared by coating a surface of a polyimide precursor with the adhesive aid composition described above in (1) or (2), and then heating the coating.

(5) A single-sided copper-clad laminate including the film described above in (4).

(6) A double-sided copper-clad laminate including the film described above in (4).

(7) A flexible printed wiring board including the film described above in (4).

(8) A multilayer printed wiring board including the film described above in (4).

ADVANTAGE OF THE INVENTION

An adhesive aid composition of the present invention is significantly improved in adhesiveness to polyimide films and the like which originally have low adhesiveness, and is easily bonded to an epoxy and the like, thereby exhibiting excellent workability. Also, the adhesive aid composition does not degrade the excellent mechanical properties possessed by an adherend film. Therefore, the adhesive aid composition can be widely used for producing a flexible printed board and a multilayer printed wiring board and is thus useful in the field of electric materials such as an adhesive, a substrate, and the like.

DETAILED DESCRIPTION

An adhesive aid composition of the present invention includes a phenolic hydroxyl group-containing polyamide and a solvent as essential components. The phenolic hydroxyl group-containing polyamide is not particularly limited as long as it has a phenolic hydroxyl group in the molecular structure of the polyamide, but preferably has a segment represented by formula (1):

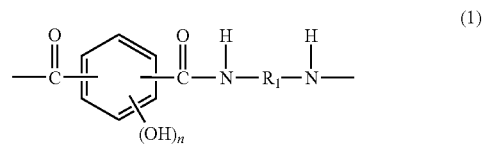

(wherein $R_1$ represents a divalent aromatic group, and n represents an average number of substituents and is a positive number of 1 to 4). An —$R_1$— group in the segment represented by formula (1) is preferably at least one of the aromatic resides represented by formula (2):

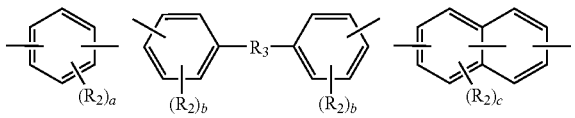

(wherein $R_2$ represents a hydrogen atom or a substituent having 0 to 6 carbon atoms which may contain O, S, P, F, or Si; $R_3$ represents a direct bond or a bond having 0 to 6 carbon atoms which may contain O, N, S, P, F, or Si; and a, b, and c represent average numbers of substituents and are positive numbers of 0 to 4, 0 to 4, and 0 to 6, respectively). In particular, an aromatic residue represented by formula (2') is preferred.

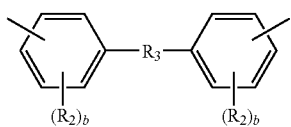

Preferred examples of $R_2$ in formula (2) include a hydrogen atom; a hydroxyl group; linear alkyl groups, such as a methyl group, an ethyl group, a propyl group, a butyl group, a pentyl group, and a hexyl group; and cyclic alkyl groups, such as a cyclobutyl group, a cyclopentyl group, and a cyclohexyl group. $R_2$s may be the same or different, but all $R_2$s preferably the same. Preferred examples of $R_3$ in formula (2) include a direct bond, —O—, —$SO_2$—, —$C(CH_3)_2$—, —$C(CF_3)_2$—, —NH—, and —$(CH_2)_{1-6}$—. When a structure of formula (21) is selected, a structure is preferably selected so that aromatic rings are bonded to fragments derived from a carboxylic acid through 4,4'-bonds.

The adhesive aid composition is suitable for a polyimide film used as an adherend and preferably used for a polyimide precursor. Therefore, the phenolic hydroxyl group-containing polyamide contained in the adhesive aid composition is preferably highly heat-resistant, for enabling thermal imidization after the use of the adhesive aid composition. In particular, the polyamide is preferably a wholly aromatic polyamide having a repeat structure represented by formula (3):

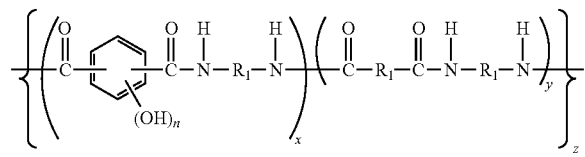

(wherein $R_1$ represents a divalent aromatic group and $R_1$s in repeat units may be the same or different; n represents an average number of substituents and is a positive number of 1 to 4; and x, y, and z represent average degrees of polymerization and are positive numbers of 1 to 10, 0 to 20, and 1 to 50, respectively).

The phenolic hydroxyl group-containing polyamide in the adhesive aid composition of the present invention is generally obtained by condensation reaction between a phenolic hydroxyl group-containing dicarboxylic acid and a diamine and, in some cases, also another dicarboxylic acid. The preferred wholly aromatic polyamide is obtained using a phenolic hydroxyl group-containing dicarboxylic acid and an aromatic diamine and, in some cases, also another aromatic dicarboxylic acid.

Examples of the phenolic hydroxyl group-containing dicarboxylic acid used include, but are not limited to, hydroxyisophthalic acid, dihydroxyisophthalic acid, hydroxyterephthalic acid, dihydroxyterephthalic acid, hydroxyphthalic acid, and dihydroxyphthalic acid. Preferred examples include, but are not limited to, 5-hydroxyisophthalic acid, 4-hydroxyisophthalic acid, 2-hydroxyisophthalic acid, 4,6-dihydroxyisophthalic acid, 2-hydroxyterephthalic acid, 2,5-dihydroxyterephthalic acid, and 4-hydroxyphthalic acid. Namely, compounds each having a carboxyl group at the meta-position relative to a hydroxyl group are preferred.

Examples of the aromatic diamine used include, but are not limited to, benzene or naphthalene diamines, such as phenylenediamine, diaminotoluene, diaminoxylene, diaminomesitylene, diaminodurene, diaminoazobenzene, and diaminonaphthalene; biphenyl diamines, such as diaminobiphenyl and diaminodimethoxybiphenyl; phenyl ether diamines, such as diaminodiphenyl ether and diaminodimethyl diphenyl ether; aniline diamines, such as methylenedianiline, methylene bis(methylaniline), methylene bis(dimethylaniline), methylene bis(methoxyaniline), methylene bis (dimethoxyaniline), methylene bis(ethylaniline), methylene bis(diethylaniline), methylene bis(ethoxyaniline), methylene bis(diethoxyaniline), isopropylidenedianiline, and hexafluoroisopropylidenedianiline; benzophenone diamines, such as diaminobenzophenone and diaminodimethylbenzophenone; diaminoanthraquinone; diaminodiphenyl thioether; diaminodimethyldiphenyl thioether; diaminodiphenyl sulfone; diaminodiphenyl sulfoxide; and diaminofluorene. Among these, phenyl ether diamines and aniline diamines are preferred, and diaminodiphenyl ether and methylene bis(diethylaniline) are particularly preferred.

Specific examples usable as the other aromatic dicarboxylic acid include, but are not limited to, isophthalic acid, terephthalic acid, biphenyldicarboxylic acid, oxydibenzoic acid, thiodibenzoic acid, dithiodibenzoic acid, carbonyldibenzoic acid, sulfonyldibenzoic acid, naphthalenedicarboxylic acid, methylenedibenzoic acid, isopropylidenedibenzoic acid, and hexafluoroisopropylidenedibenzoic acid. Among these, isophthalic acid, terephthalic acid, biphenyldicarboxylic acid, oxydibenzoic acid, and naphthalenedicarboxylic acid are preferred.

The solvent used in the adhesive aid composition of the present invention is not particularly limited as long as it dissolves the phenolic hydroxyl group-containing polyamide. Examples of the solvent include, but are not limited to, aprotic polar solvents, such as N-methyl-2-pyrrolidone, N,N-dimethylacetamide, N,N-dimethylformamide, N-methylcaprolactam, N,N-dimethylimidazolidone, dimethylsulfoxide, tetramethylurea, and pyridine; alcohol solvents, such as methanol, ethanol, propanol, and butanol; nonpolar solvents, such as toluene, xylene, hexane, cyclohexane, and heptane; acetone; methyl ethyl ketone; cyclopentanone; cyclohexanone; methyl acetate; ethyl acetate; caprolactone; butyrolactone; valerolactone; caprolactam; butyrolactam; valerolactam; tetrahydrofuran; diglyme; dioxane; trioxane; and mixed solvents thereof. In particular, N-methyl-2-pyrrolidone, N,N-dimethylacetamide, N,N-dimethylformamide, ethanol, methanol/toluene, and methanol/methyl ethyl ketone are preferred.

From the viewpoint of easy handling, the amount of the solvent used is determined so as to prepare a solution containing 5 to 50% by weight, preferably 10 to 30% by weight, of the phenolic hydroxyl group-containing polyamide. The weight-average molecular weight of the phenolic hydroxyl group-containing polyamide is preferably about 10,000 to 1,000,000. The adhesive aid composition of the present invention may further contain various additives in a range in which adhesiveness is not degraded. Examples of the additives include, but are not limited to, an organic or inorganic pigment, a dye, an antifogging agent, an antifading agent, an antihalation agent, a fluorescent whitening agent, a surfactant, a plasticizer, a frame retardant, an antioxidant, a filler, an antistatic agent, an antifoaming agent, a fluidity adjuster, an imidization catalyst, a promoter, a dehydrator, a retardant, a photostabilizer, a photocatalyst, a fungicide, an antifungal agent, a low-dielectric-constant material, a conductor, a magnetic material, and a pyrolytic compound.

As a preferred adherend to which the adhesive aid composition of the present invention is applied, a polyimide film can be used. The structure of the polyimide film is not particularly limited, but a wholly aromatic polyimide is preferred. The polyimide film is preferably used in the form of a polyimide precursor. The polyimide precursor is generally produced by reaction between a tetracarboxylic acid component and a diamine component in substantially equimolar amounts, and preferably reaction of 0.95 to 1.1 mol of the tetracarboxylic acid component per mol of the diamine component, in the solvent under a nitrogen stream.

The tetracarboxylic acid component used is not particularly limited as long as it does not contain a phenolic hydroxyl group. Examples of such a component include, but are not limited to, pyromellitic dianhydride, biphenyltetracarboxylic dianhydride, benzophenonetetracarboxylic dianhydride, diphenylsulfonetetracarboxylic dianhydride, naphthalenetetracarboxylic dianhydride, oxydiphthalic anhydride, methylene diphthalic anhydride, isopropylidene diphthalic anhydride, and hexafluoroisopropylidene diphthalic anhydride. Among these, pyromellitic dianhydride and 3,3',4,4'-biphenyltetracarboxylic dianhydride are preferred.

The diamine component used is not particularly limited as long as it does not contain a phenolic hydroxyl group. Examples of the diamine component include, but are not limited to, benzene or naphthalene diamines, such as phenylenediamine, diaminotoluene, diaminoxylene, diaminomesitylene, diaminodurene, diaminoazobenzene, and diaminonaphthalene; biphenyl diamines, such as diaminobiphenyl and diaminodimethoxybiphenyl; phenyl ether diamines, such as diaminodiphenyl ether and diaminodimethyl diphenyl ether; aniline diamines, such as methylenedianiline, methylene bis(methylaniline), methylene bis(dimethylaniline), methylene bis(methoxyaniline), methylene bis(dimethoxyaniline), methylene bis(ethylaniline), methylene bis(diethylaniline), methylene bis(ethoxyaniline), methylene bis(diethoxyaniline), isopropylidenedianiline, and hexafluoroisopropylidenedianiline; benzophenone diamines, such as diaminobenzophenone and diaminodimethylbenzophenone; diaminoanthraquinone; diaminodiphenyl thioether; diaminodimethyldiphenyl thioether; diaminodiphenyl sulfone; diaminodiphenyl sulfoxide; and diaminofluorene. These compounds may be used in a combination of any two or more. However, a combination of a benzene or naphthalene diamine, preferably p-phenylenediamine, and a phenyl ether diamine, preferably 3,4'-diaminodiphenyl ether or 4,4'-diaminodiphenyl ether, is preferably used.

These tetracarboxylic dianhydrides and diamines can be used as mixtures of two or more each. The characteristics of the resultant polyimide film can be controlled by controlling the combinations and ratios of the tetracarboxylic dianhydrides and the diamines. For example, the polyimide film produced using the tetracarboxylic acid component including 100 mol % of 3,3',4,4'-biphenyltetracarboxylic dianhydride and the diamine component including 75 mol % of p-phenylenediamine and 25 mol % of 4,4'-diaminodiphenyl ether has a tensile modulus of 4 to 5 GPa and a linear expansion coefficient of about $2.0\times10^{-5}/°$ C. The polyimide film produced using the tetracarboxylic acid component including 100 mol % of 3,3',4,4'-biphenyltetracarboxylic dianhydride and the diamine component including 100 mol % of p-phenylenediamine has a tensile modulus of 5 GPa or more and a linear expansion coefficient of about $1.5\times10^{-5}/°$ C. The polyimide film produced using the tetracarboxylic acid component including 100 mol % of pyromellitic dianhydride and the diamine component including 100 mol % of 4,4'-diaminodiphenyl ether has a tensile modulus of 4 GPa or more and a linear expansion coefficient of about $2.5\times10^{-5}/°$ C.

Preferred combinations and ratios of the tetracarboxylic dianhydride and diamine other than the above are given below together with the above-described combinations.

| Tetracarboxylic acid component | Diamine component |
| --- | --- |
| 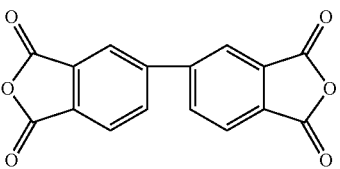<br>BPDA<br>3,3',4,4'-biphenyltetracarboxylic<br>dianhydride<br>100 mol % | <br>PDA<br>p-phenylenediamine<br>100 mol % |

-continued

| Tetracarboxylic acid component | Diamine component |
|---|---|
| BPDA 100 mol % | DAPE 4,4′-diaminodiphenyl ether 100 mol % |
| PMDA pyromellitic dianhydride 100 mol % | PDA 100 mol % |
| PMDA 100 mol % | DAPE 100 mol % |
| BPDA 100 mol % | PDA 75 mol % / DAPE 25 mol % |
| PMDA 100 mol % | PDA x mol % / DAPE 100-x mol % |
| BPDA x mol % / PMDA 100-x mol % | PDA 100 mol % |

-continued

| Tetracarboxylic acid component | Diamine component |
|---|---|
| 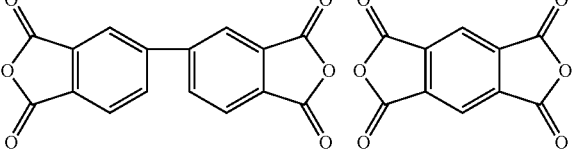 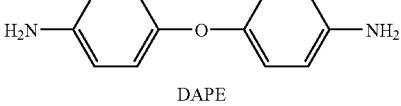<br>BPDA x mol %  PMDA 100-x mol % | 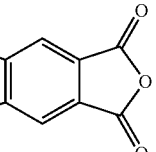<br>DAPE 100 mol % |
| 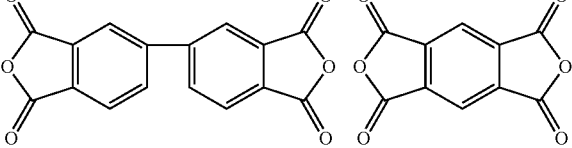 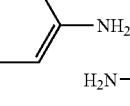<br>BPDA x mol %  PMDA 100-x mol % | 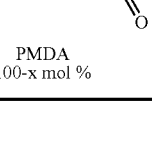 <br>PDA x mol %  DAPE 100-x mol % |

Specific examples of the solvent used in the reaction for producing the polyimide precursor include, but are not limited to, aprotic polar solvents, such as N-methyl-2-pyrrolidone, N,N-dimethylacetamide, N,N-dimethylformamide, N-methylcaprolactam, N,N-dimethylimidazolidone, dimethylsulfoxide, tetramethylurea, and pyridine; nonpolar solvents, such as toluene, xylene, hexane, cyclohexane, and heptane; acetone; methyl ethyl ketone; cyclopentanone; cyclohexanone; methyl acetate; ethyl acetate; caprolactone; butyrolactone; valerolactone; tetrahydrofuran; diglyme; dioxane; trioxane; and solvent mixtures thereof. In particular, N-methyl-2-pyrrolidone, N,N-dimethylacetamide, and a N-methyl-2-pyrrolidone/N,N-dimethylacetamide mixed solvent are preferred.

In view of easy handling, the polyimide precursor is preferably dissolved in an amount of 5 to 50% by weight and preferably 10 to 30% by weight in the solvent. The weight-average molecular weight of the polyimide precursor is preferably 10,000 to 1,000,000. When a catalyst and a dehydrator are added to the solution, subsequent imidization is accelerated, and thus the polyimide film can be obtained under relatively mild conditions.

In a method for using the adhesive aid composition of the present invention, preferably, the polyimide precursor solution is applied to a substrate so that an imide film has a desired thickness, and dried at 50° C. to 150° C. for 50 to 180 minutes to prepare a polyimide precursor film. On top of that the adhesive aid composition of the present invention is applied to the precursor film, dried at 50° C. to 150° C. for 5 to 180 minutes, and then the polyimide precursor is subjected to imidization by heating at 200° C. to 500° C. for 20 to 300 minutes in a nitrogen stream to prepare a surface-adhesive film. In a system containing the polyimide precursor, a catalyst and a dehydrator, imidization can be performed at a lower temperature or within a shorter time. The resultant film of the present invention is used together with the substrate or after being separated from the substrate.

The substrate is not particularly limited, and any substrate which can resist imidization conditions, such as a glass substrate, a copper foil, a stainless steel substrate, a drum, or an endless belt, can be used. However, the use of a copper foil provides a single-sided copper-clad laminate. With respect to the thickness of the adhesive aid composition applied, the adhesive aid composition is preferably applied so that the thickness of the phenolic hydroxyl group-containing polyamide is 1 to 20 μm and preferably 3 to 10 μm.

The film of the present invention has phenolic hydroxyl groups localized on the surface thereof, and also has polarity and reactivity. Therefore, the film is highly reactive to films containing adhesives containing various epoxy compounds and bonded thereto with excellent adhesive strength. For example, when the film surfaces of the above-described single-sided copper-clad laminates are bonded together with an epoxy compound-containing adhesive, a double-sided copper-clad laminate having excellent adhesive strength can be obtained. The phenolic hydroxyl group-containing polyamide is absent from the interface between a copper foil and a film of a copper-clad laminate, and thus the electric properties possessed by the polyimide are little affected. Even when the copper-clad laminate is further processed, a flexible printed wiring board or a multilayer printed wiring board having excellent adhesive strength can be obtained. The epoxy compound-containing adhesive contains an epoxy compound, a curing agent therefor, and, in some cases, a solvent and a flexibilizer such as a phenolic hydroxyl group-containing polyamide or the like, and exhibits an adhesive effect by itself.

EXAMPLES

Although the present invention will be described in further detail below with reference to examples, the present invention is not limited to these examples.

The characteristics of a film were measured by the following methods:

(Measurement of Tensile Modulus)

A film was measured with a Tensilon tester (manufactured by Baldwin Co.,) according to ASTM D882.

(Measurement of Linear Expansion Coefficient)

A film was measured by a tensile method (load of 1.0 to 5.0 g) using TMA-8140 (manufactured by Rigakudenki Co., Ltd.) from room temperature to 500° C. at a heating rate of 5° C./min in a nitrogen stream to determine an average linear expansion coefficient from room temperature to 200° C.

(Measurement of Peel Strength of Double-Sided Copper-Clad Laminate)

A double-sided copper-clad laminate was measured with a Tensilon tester (manufactured by Baldwin Co.,) according to JIS C6481.

Synthesis Example 1

In a 500 ml reactor provided with a thermometer, a reflux condenser, a dropping funnel, a nitrogen feed device, and a stirrer, 30.59 g (0.168 mol) of 5-hydroxyisophthalic acid, 53.20 g (0.171 mol) of 4,4'-methylenebis(2,6-diethylaniline), and 7.35 g of lithium chloride were charged, and 283.5 g N-methyl-2-pyrrolidone and 39.20 g of pyridine were added to the resultant mixture under a dry nitrogen stream. Then, the mixture was slowly heated under stirring until the temperature in the reactor was 95° C. to dissolve a solid component. Then, 85.40 g of triphenyl phosphite was added dropwise to the mixture over 2 hours under stirring while the temperature in the reactor being kept at 95° C. After the addition, the mixture was heated until the temperature in the reactor was 120° C. to effect further reaction for 2 hours. As a result, a phenolic hydroxyl group-containing polyamide was synthesized.

After the completion of the reaction, the reaction solution was cooled to room temperature and then poured into a 1000 ml vessel, and then 40 g of methanol was added to the solution at room temperature under stirring. Next, 450 g of a 25 wt % aqueous sodium hydroxide solution was added to the resultant mixture, followed to further stirring for 1 hour to prepare a yellow transparent solution. The yellow transparent solution was added to 1500 g of distilled water in a 3000 ml vessel under vigorous stirring, and 420 g of 18 wt % hydrochloric acid was further added to the solution to precipitate the product.

The resultant precipitate was filtered off and then slowly added to a mixture containing 560 g of methanol and 56 g of a 25 wt % aqueous sodium hydroxide solution in a 1000 ml vessel under stirring, followed by stirring for 1 hour to dissolve the precipitate and again prepare a yellow transparent solution. In a 2000 ml vessel, 350 g of distilled water, 350 g methanol, and 140 g of 18 wt % hydrochloric acid were charged, and the yellow transparent solution was added to the resultant mixture under vigorous stirring to again precipitate the product. The resultant precipitate was filtered off, slowly added to 600 g of distilled water in a 1000 ml vessel under stirring, washed by stirring for 1 hour, and then filtered off. Next, the filtered substance was charged in a 1000 ml reactor, and 600 g of distilled water was added thereto. Then, the resultant mixture was slowly heated under stirring until the temperature in the reactor become 95° C., and then stirred for washing at 95° C. for 2 hours. Next, the mixture was cooled to room temperature and filtered, and the filtered substance was dried to obtain 74.0 g (yield 95.0%) of a phenolic hydroxyl group-containing polyamide represented by formula (4):

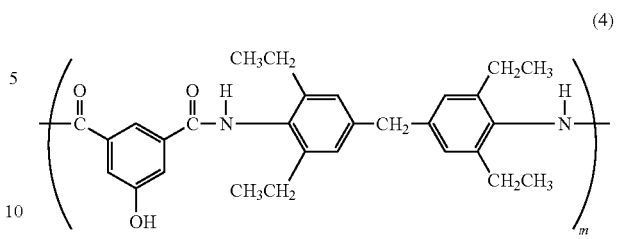

(4)

(wherein m represents an average degree of polymerization, and the weight-average molecular weight is 32,000). Then, 0.100 g of the phenolic hydroxyl group-containing polyamide powder was dissolved in 20.0 ml of N,N-dimethylacetamide. The logarithmic viscosity measured at 30° C. was 0.32 dl/g.

Synthesis Example 2

In a 500 ml reactor provided with a thermometer, a reflux condenser, a dropping funnel, a nitrogen feed device, and a stirrer, 15.30 g (0.084 mol) of 5-hydroxyisophthalic acid, 13.95 g (0.084 mol) of isophthalic acid, 34.24 g (0.171 mol) of 3,4!-diaminodiphenyl ether, and 5.57 g of lithium chloride were charged, and 214.8 g N-methyl-2-pyrrolidone and 39.20 g of pyridine were added to the resultant mixture under a dry nitrogen stream. Then, the mixture was slowly heated under stirring until the temperature in the reactor was 95° C. to dissolve a solid component. Then, 85.40 g of triphenyl phosphite was added dropwise to the mixture over 2 hours under stirring while the temperature in the reactor being kept at 95° C. After the addition, the temperature in the reactor was kept at 95° C. to effect further reaction for 2 hours. As a result, a phenolic hydroxyl group-containing polyamide was synthesized.

After the completion of the reaction, the reaction solution was cooled to room temperature and then poured into a 1000 ml vessel, and then 50 g of methanol was added to the solution at room temperature under stirring. Next, 200 g of a 25 wt % aqueous sodium hydroxide solution was added to the resultant mixture, followed to further stirring for 1 hour to prepare a dark brown solution. The dark brown solution was added to 1500 g of distilled water in a 3000 ml vessel under vigorous stirring, and 200 g of 18 wt % hydrochloric acid was further added to the solution to precipitate the product.

The resultant precipitate was filtered off and then slowly added to a mixture containing 560 g of methanol and 30 g of a 25 wt % aqueous sodium hydroxide solution in a 1000 ml vessel under stirring, followed by stirring for 1 hour to again prepare a dark brown solution. In a 2000 ml vessel, 350 g of distilled water, 350 g methanol, and 75 g of 18 wt % hydrochloric acid were charged, and the dark brown solution was added to the resultant mixture under vigorous stirring to again precipitate the product. The resultant precipitate was filtered off, slowly added to 600 g of distilled water in a 1000 ml vessel under stirring, washed by stirring for 1 hour, and then filtered off. Next, the filtered substance was charged in a 1000 ml reactor, and 600 g of distilled water was added thereto. Then, the resultant mixture was slowly heated under stirring until the temperature in the reactor become 95° C., and then stirred for washing at 95° C. for 2 hours. Next, the mixture was cooled to room temperature and filtered, and the filtered substance was dried to obtain 61.6 g (yield 97.0%) of a phenolic hydroxyl group-containing polyamide represented by formula (5):

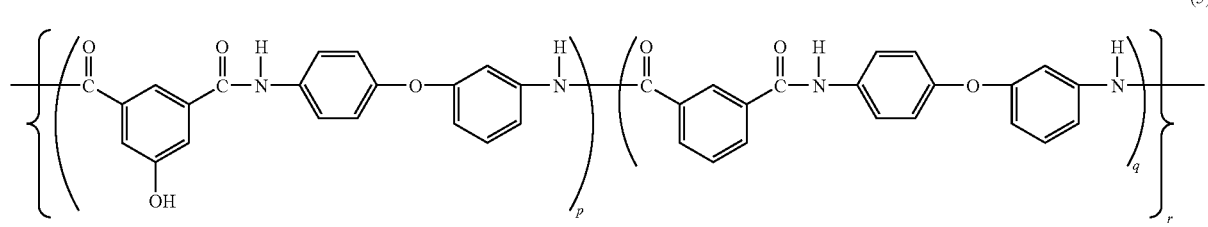

(5)

(wherein p, q, and r each represent an average degree of polymerization, p=q, and the weight-average molecular weight is 32,000). Then, 0.100 g of the phenolic hydroxyl group-containing polyamide powder was dissolved in 20.0 ml of N,N-dimethylacetamide. The logarithmic viscosity measured at 30° C. was 0.45 dl/g.

Synthesis Example 3

In a 500 ml reactor provided with a thermometer, a reflux condenser, a powder inlet, a nitrogen feed device, and a stirrer, 13.04 g (0.121 mol) of p-phenylenediamine and 4.320 g (0.022 mol) of 4,4'-diaminodihenyl ether were charged, and 420.0 g N-methyl-2-pyrrolidone was added to the mixture under a dry nitrogen stream. Then, a solid component was dissolved under stirring at room temperature. Then, 42.72 g (0.145 mol) of 3,3'4,4'-biphenyltetracarboxylic acid was added to the mixture through the powder inlet over about 2 hours under stirring while the temperature in the reactor being kept at 45° C. or less. After the addition, the temperature in the reactor was kept at 35° C. or less to effect further reaction for 16 hours. After the completion of the reaction, the reaction mixture was filtered under pressure through a Teflon (trade name) filter having a pore size of 3 μm to obtain 463 g (yield 95.9%) of a solution containing 12.5% by weight of a polyimide precursor represented by formula (6) in N-methyl-2-pyrrolidone:

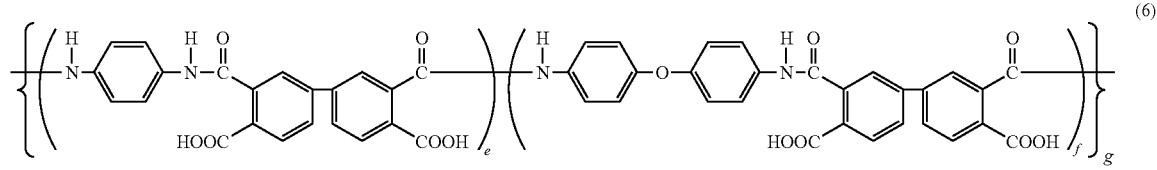

(6)

(wherein e, f, and g each represent an average degree of polymerization, e:f=75:25, and the weight-average molecular weight is 83,000). Then, 1.00 ml of the resultant polyimide precursor solution was measured at 25° C. with an E-type rotational viscometer. As a result, the rotational viscosity was 1,170 mPa·s.

Example 1

In 160 g of N-methyl-2-pyrrolidone, 40 g of the phenolic hydroxyl group-containing polyamide synthesized in Synthesis Example 1 and represented by formula (4) was dissolved to prepare an adhesive aid composition of the present invention.

Example 2

In 160 g of N-methyl-2-pyrrolidone, 40 g of the phenolic hydroxyl group-containing polyamide synthesized in Synthesis Example 2 and represented by formula (5) was dissolved to prepare an adhesive aid composition of the present invention.

Example 3

The solution of the polyimide precursor obtained in Synthesis Example 3 and represented by formula (6) was applied to a thickness of 150 μm on an electrolytic copper foil (manufactured by Japan Energy Co., Ltd.) of 18 μm in thickness using an automatic applicator (manufactured by Yasuda Seiki Seisakusho, Ltd.) and then dried at 130° C. for 10 minutes. Then, the adhesive aid composition obtained in Example 1 was applied to a thickness of 30 μm on the polyimide precursor and then dried at 130° C. for 10 minutes. Then, the resultant laminate was heated from 130° C. to 350° C. over 2 hours in a nitrogen stream and further imidized by heat treatment at 350° C. for 2 hours to prepare a surface-adhesive single-sided copper-clad laminate of the present invention. A film obtained by etching the copper foil had a thickness of 21 μm, a tensile modulus of 5.3 GPa, and a linear expansion coefficient of 23.

Example 4

The solution of the polyimide precursor obtained in Synthesis Example 3 and represented by formula (6) was applied to a thickness of 150 μm on an electrolytic copper foil (manufactured by Japan Energy Co., Ltd.) of 18 μm in thickness using an automatic applicator (manufactured by Yasuda Seiki Seisakusho, Ltd.) and then dried at 130° C. for 10 minutes. Then, the adhesive aid composition obtained in Example 2 was applied to a thickness of 30 μm on the polyimide precursor and then dried at 130° C. for 10 minutes. Then, the resultant laminate was heated from 130° C. to 350° C. over 2 hours in a nitrogen stream and further imidized by heat treatment at 350° C. for 2 hours to prepare a surface-adhesive single-sided copper-clad laminate of the present invention. A film obtained by etching the copper foil had a thickness of 22 μm, a tensile modulus of 5.1 GPa, and a linear expansion coefficient of 25.

Example 5

The resin surfaces of the single-sided copper-clad laminates obtained in Example 3 were bonded together with an epoxy adhesive including 50 parts by weight of EPPN-501H (triphenylmethane skeleton-containing novolac epoxy resin manufactured by Nippon Kayaku Co., Ltd., epoxy equivalent 167 g/eq), 50 parts by weight of RE-310S (bisphenol A epoxy resin manufactured by Nippon Kayaku Co., Ltd., epoxy equivalent 182 g/eq), 54.5 parts by weight of Kayahard TPM (triphenylmethane skeleton-containing novolac resin manufactured by Nippon Kayaku Co., Ltd., hydroxyl group equivalent 97 g/eq), 70 parts by weight of Kayaflex (phenolic hydroxyl group-containing aromatic polyamide-poly(butadiene-acrylonitrile) block copolymer manufactured by Nippon Kayaku Co., Ltd.), 5 parts by weight of DHT-4A (Hydrotalsite ion scavenger, $Mg_{4.3}Al_2(OH)_{12.6}CO_3 \cdot 3.5H_2O$, manufactured by Kyowa Chemical Industry Co., Ltd.), 2 parts by weight of IXE-100 (zirconium phosphate ion scavenger manufactured by To a Gosei Co., Ltd.), and 50 parts by weight of CS-3N-A (high-purity calcium carbonate manufactured by Ube Materials Co., Ltd., purity 99.9% or more). Then, the laminate was press-bonded under heating at 170° C. and 5 MPa for 60 minutes to prepare a double-sided copper-clad laminate of the present invention.

Example 6

The resin surfaces of the single-sided copper-clad laminates obtained in Example 4 were bonded together with an epoxy adhesive including 100 parts by weight of NC-3000 (biphenyl skeleton-containing epoxy resin manufactured by Nippon Kayaku Co., Ltd., epoxy equivalent 275 g/eq), 35.3 parts by weight of Kayahard TPM (triphenylmethane skeleton-containing novolac resin manufactured by Nippon Kayaku Co., Ltd., hydroxyl group equivalent 97 g/eq), 70 parts by weight of Kayaflex (phenolic hydroxyl group-containing aromatic polyamide-poly(butadiene-acrylonitrile) block copolymer manufactured by Nippon Kayaku Co., Ltd.), and 2 parts by weight of triphenylphosphine (TPP) serving as a curing promoter. Then, the resultant laminate was press-bonded under heating at 170° C. and 5 MPa for 60 minutes to prepare a double-sided copper-clad laminate of the present invention.

Comparative Example 1

A single-sided copper-clad laminate (film thickness 18 μm, tensile modulus 5.7 GPa, and linear expansion coefficient 21) was prepared by the same method as in Example 2 except that the adhesive aid composition of the present invention was not applied to a polyimide precursor. Also, a double-sided copper-clad laminate was prepared by the same method as in Example 3 using an epoxy adhesive.

The results of peel strength of the double-sided copper-clad laminates of Examples 5 and 6 and Comparative Example 1 are shown in the table below.

TABLE 1

|  | Example 5 | Example 6 | Comparative Example 1 |
|---|---|---|---|
| Peel strength | 9.5 N/cm | 10.8 N/cm | 6.3 N/cm |
| Peel interface | copper foil/film | copper foil/film | epoxy adhesive/film |

The above-mentioned patents, applications, test methods, and publications are hereby incorporated by reference in their entirety.

Many variations of the present invention will suggest themselves to those skilled in the art in light of the above detailed description. All such obvious variations are within the fully intended scope of the appended claims.

The invention claimed is:

1. A process for producing a surface-adhesive film comprising applying a polyimide precursor solution to a substrate, drying the polyimide precursor solution to prepare a polyimide precursor film, applying an adhesive aid composition containing a phenolic hydroxyl group-containing polyamide and a solvent to the polyimide precursor film, drying the adhesive aid composition, and then imidizing the polyimide precursor by heating at 200° C. to 500° C.

2. The process for producing a surface-adhesive film according to claim 1, wherein the phenolic hydroxyl group-containing polyamide is a polyamide having a repeat structure represented by formula (3):

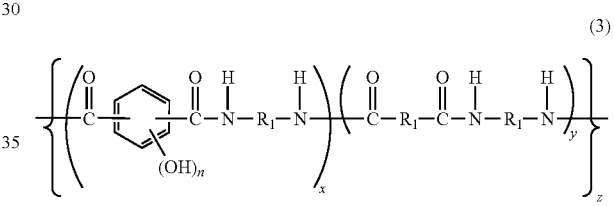

(wherein $R_1$ represents a divalent aromatic group and $R_1$s in repeating units may be the same or different; n represents an average number of substituents and is a positive number of 1 to 4; and x, y, and z represent average degrees of polymerization and are positive numbers of 1 to 10, 0 to 20, and 1 to 50, respectively).

3. The process for producing a surface-adhesive film according to claim 1, wherein the precursor solution is dried at 50° C. to 150° C. for 5 to 180 minutes, the adhesive aid composition is dried at 50° C. to 150° C. for 5 to 180 minutes, and the polyimide precursor is heated at 200° C. to 500° C. for 20 to 300 minutes under a nitrogen stream.

4. A film produced by the process according to claim 1.

5. A single-sided copper-clad laminate comprising the film prepared according to claim 4.

6. A double-sided copper-clad laminate comprising the film prepared according to claim 4.

7. A flexible printed wiring board comprising the film prepared according to claim 4.

8. A multilayer printed wiring board comprising the film prepared according to claim 4.

9. The process for producing a surface-adhesive film according to claim 2, wherein the precursor solution is dried at 50° C. to 150° C. for 5 to 180 minutes, the adhesive aid composition is dried at 50° C. to 150° C. for 5 to 180 minutes, and the polyimide precursor is heated at 200° C. to 500° C. for 20 to 300 minutes under a nitrogen stream.

* * * * *